(12) United States Patent
Waters

(10) Patent No.: US 11,675,946 B1
(45) Date of Patent: Jun. 13, 2023

(54) PROGRAMMABLE NETWORK SWITCH FOR USER PLANE FUNCTION

(71) Applicant: Sprint Spectrum LP, Overland Park, KS (US)

(72) Inventor: Brian Waters, Angel Fire, NM (US)

(73) Assignee: Sprint Spectrum LP, Overland Park, KS (US)

( * ) Notice: Subject to any disclaimer, the term of this patent is extended or adjusted under 35 U.S.C. 154(b) by 219 days.

(21) Appl. No.: 16/927,421

(22) Filed: Jul. 13, 2020

(51) Int. Cl.
| | |
|---|---|
| G06F 15/173 | (2006.01) |
| G06F 30/331 | (2020.01) |
| H04L 67/14 | (2022.01) |
| H04L 12/66 | (2006.01) |
| H04L 45/745 | (2022.01) |
| H04L 69/22 | (2022.01) |

(52) U.S. Cl.
CPC ............ *G06F 30/331* (2020.01); *H04L 12/66* (2013.01); *H04L 45/745* (2013.01); *H04L 67/14* (2013.01); *H04L 69/22* (2013.01)

(58) Field of Classification Search
CPC ..... G06F 30/331; H04L 12/66; H04L 45/745; H04L 67/14; H04L 69/22
USPC ........................................................ 709/238
See application file for complete search history.

(56) References Cited

U.S. PATENT DOCUMENTS

| | | | | |
|---|---|---|---|---|
| 7,990,847 B1* | 8/2011 | Leroy | .................. | H04L 43/0817 709/227 |
| 10,541,915 B2* | 1/2020 | Ryan | ..................... | H04L 49/355 |
| 2004/0008649 A1* | 1/2004 | Wybenga | ............... | H04W 88/16 370/338 |
| 2009/0109974 A1* | 4/2009 | Shetty | .................. | H04L 49/3009 370/392 |
| 2010/0083345 A1* | 4/2010 | Panwar | .................... | H04L 45/00 726/1 |
| 2013/0343408 A1* | 12/2013 | Cook | ..................... | H04L 69/161 370/474 |
| 2015/0110110 A1* | 4/2015 | Griswold | .............. | H04L 45/745 370/392 |
| 2016/0119165 A1* | 4/2016 | Keronen | ............... | H04W 72/02 370/254 |
| 2017/0324768 A1* | 11/2017 | Crabtree | ............. | H04L 63/1433 |
| 2019/0036868 A1* | 1/2019 | Chandrashekhar | ... | H04L 45/021 |

(Continued)

FOREIGN PATENT DOCUMENTS

WO     2019/168458 A1    9/2019

OTHER PUBLICATIONS

Dredge, S., "Intel and Metaswitch Lights-Up the 5G Core with a 500 Gbps Cloud Native UPF," Metaswitch Networks (2020).

*Primary Examiner* — Lan Dai T Truong
(74) *Attorney, Agent, or Firm* — Jones Robb, PLLC

(57) ABSTRACT

Programmable network switches configured to perform various functions including session management, data processing, routing, and pipeline processing functions. Exemplary programmable network switches include pipeline processing components to transport data packets to network nodes, and data processing components to perform management functions including instructing the pipeline processing component how to transport the data packets. Auxiliary processing components can also be included to perform pre and post processing. The pipeline processing and auxiliary processing components can include ASICs, FPGAs, and other processors in any combination within a single rack mountable unit.

18 Claims, 9 Drawing Sheets

(56) References Cited

U.S. PATENT DOCUMENTS

| | | | |
|---|---|---|---|
| 2019/0075606 A1* | 3/2019 | Myhre | H04W 36/0033 |
| 2019/0149437 A1* | 5/2019 | Hegde | H04L 43/12 |
| | | | 370/252 |
| 2020/0177525 A1* | 6/2020 | Morris | H04L 49/552 |
| 2020/0213154 A1* | 7/2020 | Han | H04L 47/125 |
| 2021/0219004 A1* | 7/2021 | Parekh | G06V 40/1318 |

* cited by examiner

PROGRAMMABLE NETWORK SWITCH FOR USER PLANE FUNCTION

TECHNICAL BACKGROUND

As communication networks evolve and grow, there are ongoing challenges in communicating data across different types of networks. A communication network can include, for example, a combination of a wireless network and a packet data network such as the internet. Other types of communication networks in various combinations may be envisioned by those having ordinary skill in the art, such as wireline networks, local area networks (LANs), wide area networks (WANs), telephone networks, cellular networks, satellite networks, packet switched networks, and so on. Communicating data between these different types of networks requires specialized components, such as gateways, routers, switches, etc. For example, 4G networks utilize serving gateways (S-GW) and packet gateways (P-GW) located in the core network, and 5G networks utilize various servers collectively referred to as the session management function (SMF) and user plane function (UPF) to perform similar functions. Gateways and switches are useful for routing data packets from a source node to a destination node and traversing different networks, e.g. from an end-user wireless device attached to an access node, to a server on the internet, etc.

Further, there have been efforts to decouple session management from packet processing, such efforts being generally described as control and user plane separation (CUPS). While these CUPS efforts are useful, there still remain inefficiencies with transmitting data through existing gateways. For example, with increasing numbers of wireless devices and complexity of radio-access networks (RANs), there is more data being routed through core gateways or other servers prior to being routed. Thus, large amounts of data still have to traverse different network nodes in order to be properly routed to their destinations. Data in the order of billions of packets per second traverses modern networks, thus requiring specialized packet switching hardware such as robust network switches. Existing switches comprise hardware components programmed strictly for packet processing, with very little processing dedicated towards "management" functions including routing, bearer establishment, quality of service, guaranteed bit rate, charging and policy controls, etc.

Thus, some type of external server or host is normally used to instruct the network switches how to operate, including which other network elements to communicate with, managing create, update and delete functions associated with allocating capacity for individual users, generating billing records/reports, etc. Existing 4G CUPS user planes and 5G UPFs thus utilize a combination of general purpose servers in communication with the aforementioned network switches. However, there are limitations with these implementations, specifically with regards to throughput limitations as to the amount of data that can be processed. This is partly due to the extra communication that is required between the switching hardware components and the external hosts/servers. Further, capacity limitations of general purpose servers result in lower-than-optimal throughput, which is undesirable for operators of modern communication networks.

Further, while it is increasingly desirable to separate the user plane from the control plane, particularly when it comes to outer edges of communication networks, these servers are usually deployed close to a center or "core" network. Meanwhile, deploying additional host server hardware adjacent network switches towards the "edge" of a network can consume extra resources such as power, storage space, and cooling, which are already limited towards the edge of these networks, e.g. at cell sites or generally closer to access nodes such as eNodeBs, gNodeBs, base stations, etc.

Overview

Exemplary embodiments described herein include programmable network switches that are configured to perform various functions including session management, data processing, pre-processing, post-processing, pipeline processing, and data transport and switching functions. Further described herein are systems including such programmable network switches, and methods executed by various components in such systems.

An exemplary programmable network switch includes a switching component configured to transport data packets to different network nodes, and a processing node configured to perform management functions, the management functions including instructing the switching component how to transport the data packets, wherein the switching component and processing node are combined into a single housing of the programmable network switch.

DETAILED DESCRIPTION

Figure 1:
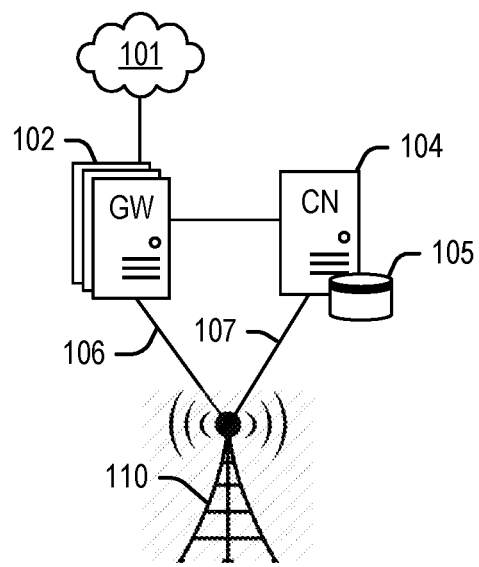
FIG. 1 depicts an exemplary system.
Figure 1:
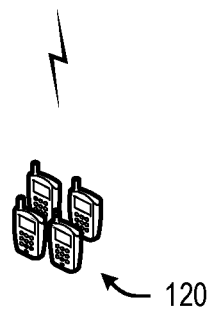

Embodiments disclosed herein provide programmable network switches that include modules for performing data management functions and data transport functions within a compact and modular hardware unit. Such a programmable network switch may enhance or replace the myriad existing packet gateways, such as a CUPS based user plane S-GW, P-GW, or SAE-GW in 4G networks, and a user plane function (UPF) in 5G networks. The programmable network switch may comprise a "white box" switch that combines a pipeline processing component with a management module (or data management application) that is executed on a network operating system (NOS), using a processor (such as, for example, an X86 processor). The network operating system may be based on the Open Network Linux (ONL) framework. The management module performs functions that are typically performed by an external host server. Meanwhile, the pipeline processing component itself can be embedded into a hardware chip, such as an application-specific integrated circuit (ASIC), or a field programmable gate array (FPGA). The ASIC/FPGA may be configured as a network switch and may receive information from the data management application (via the NOS), such as session data, routing tables, etc. as further described herein. Integrating a management module into a single unit with the pipeline processing component provides numerous significant advantages over the prior art as further described herein.

In addition, such a programmable network switch may comprise multiple hardware circuits and software modules associated with the different types of functions, all of which are incorporated into a single hardware unit, such as a rack-mountable unit. For example, the programmable network switch can also include an auxiliary processing component or circuit embedded on, for instance, another ASIC or FPGA. The auxiliary processing component is integrated into the programmable network switch along with the pipeline processing component and the management module. The auxiliary processing circuit can be configured with more memory than the pipeline processing component, and can also receive session data and routing tables and other information from the data management application. Thus, data packets associated with data sessions are routed through a "pipeline" of pre-processing, pipeline processing, and post-processing operations, enabled by real-time communication between the different circuits and modules, as further described herein.

This configuration stands in contrast to prior-art gateways and UPFs that comprise separate hardware switches and external host servers that may consume excessive network resources as described above. Whereas in the prior art, an external host server communicates with a switch and instructs a hardware switch with regards to data management, in the disclosed embodiments, the data management functions described herein are programmed into an internal host or "processing node" that is incorporated within the programmable network switch. This eliminates the need for an external host server, as well minimizing excessive communication and signaling that is required to communicate between the prior-art programmable switches and external host servers. Thus, providing a programmable network switch with host, session management, and pipeline processing functions that interface with each other and perform data processing within a single unit preserves network resources such as power, bandwidth, etc.

Exemplary programmable network switches described herein replace the myriad components of existing 4G CUPS gateways and 5G UPFs, and may similarly be positioned or located at various points within a network topology depending on a network operator's requirement. In an exemplary embodiment, a programmable network switch as described herein can be co-located with an access node, such as a gNodeB or eNodeB, such that data flows may directly egress from the user plane at the radio access network (RAN) to the destination network. For example, the programmable network switch can replace a user plane or data plane elements of a system architecture evolution (SAE) gateway in 4G networks, or can replace an intermediate UPF (iUPF) in 5G networks. This eliminates having to transport the data packets to central sites or networks. In further embodiments described herein, several programmable network switches can be arranged such that data packets originating from various RANs can traverse minimal other networks or nodes to reach their destination. Incorporating data management functions into these programmable network switches also minimizes the need for extra control plane elements and communication therebetween.

The data management functions performed by exemplary programmable network switches disclosed herein can include communicating with other network components, such as a controller node, managing health of different network nodes such as eNodeBs, gNodeBs, other components of a UPF, or any network node along the data path, as well as tunnel identification management, session identifier management, and so on. In exemplary embodiments, the programmable network switch receives control-plane instructions from a session management function (SMF) in the case of 5G, and the SGW-C and PGW-C in the case of 4G. Based on the instructions from the controller node, a processing node of the programmable network switch can determine how to process the data sessions associated with the data packets it receives. The processing node can include a management module configured to transmit session data, routing tables, and other information to the pipeline processing circuit and/or the auxiliary processing circuit. The pipeline processing and/or auxiliary processing circuits can perform operations including updating packet headers, applying quality of service (QoS) policies, and forwarding/transporting the data packets associated with the data sessions, based on the information received form the processing node. Other examples of the operations performed by the auxiliary processing and pipeline processing circuits include collection of usage data, data buffering, reporting of exceptions to the data management module, and so on.

Therefore, a programmable network switch described herein includes at least a pipeline processing component configured to transport data packets to different network nodes according to session data, and a data processing component (or processing node) configured as a host module, i.e. to perform management functions including managing the session lifecycle and instructing the pipeline processing component on how to manipulate and transport the data packets. These components are combined into a single housing of the programmable network switch. For example, the pipeline processing component is embedded on a first circuit within the single housing, and a management module is stored on a memory of the programmable network switch and executed by a processor communicatively coupled to the first circuit. In an exemplary embodiment, the first circuit comprises an ASIC, FPGA, or equivalent, and the processing node comprises a memory and a general-purpose processor (such as an X86 processor). Further, an auxiliary processing component can be embedded on a second circuit within the single housing. In an exemplary embodiment, the second circuit comprises another ASIC or FPGA, including a memory for performing pre-processing and post-processing operations as further described herein. For example, the pipeline processing circuit can include any end-user switch chip, such as the TOFINO® or TOFINO2® chip manufactured by BAREFOOT NETWORKS®, or the SILICONE ONE® manufactured by CISCO SYSTEMS INC.®. In light of this disclosure, it will be evident to those having ordinary skill in the art that any specialized circuits including FPGAs, ASICs, and other types of processors, can be configured to perform the pipeline processing, auxiliary processing (i.e. pre and post processing), and data management operations, so long as they are in direct communication with each other and incorporated within a small 1-2 unit network node, thereby mitigating the need for extraneous communication across different network nodes in different geographical regions.

FIG. 1 depicts an exemplary system 100, including a communication network 101, gateway node(s) 102, controller node 104, access node 110, and wireless devices 120. Access node 110, along with other components (not illustrated herein), can be part of a radio access network (RAN) of a wireless network, and controller node 104 can be part of a core network of the wireless network. The one or more gateway node(s) 102 can include a 4G CUPS gateway, 5G UPF, or any other type of gateway. Further, the one or more gateway node(s) 102 can be distributed in various portions of the wireless network, such as coupled to access node 110 in the RAN, located within the core network, etc. In an exemplary embodiment, the one or more gateway node(s) 102 include a programmable network switch as further described herein. Further, it is noted that while access node 110, wireless devices 120, gateway node(s) 102, and controller node 104 are illustrated in FIG. 1, any number of identical or additional network nodes and devices can be implemented. For example, FIGS. 7-9 respectively illustrate components of exemplary 4G and 5G networks.

Further, and as described in detail herein, one or more processing nodes and/or programmable network switches may be incorporated within system 100. For example, the one or more processing nodes and/or programmable network switches may be included within one or more gateway node(s) 102, at any logical or physical location within system 100. In an exemplary embodiment, a programmable network switch incorporates a processing node including a management module configured to manage data sessions and life cycles associated with data packets transmitted between wireless devices 120 and communication network 101. The programmable network switch can further include a pipeline processing component configured to transport data packets associated with the data sessions to different network nodes, based on session data received from the management module. The pipeline processing component and management module are combined into a single housing of the programmable network switch. For example, the pipeline processing component is embedded on a first circuit within the single housing, and the management module is stored on a memory of the programmable network switch and executed by a processor communicatively coupled to the first circuit (i.e. a processing node as further described herein). Further, an auxiliary processing component can be embedded on a second circuit within the single housing. Thus, data management operations performed by the programmable network switch include exchanging data packets and updated data session information between the management module, the auxiliary processing component, and the pipeline processing component.

As described herein, the functions performed by exemplary programmable network switches disclosed herein include receiving control information from a session management server, associating source nodes, destination nodes, bearers, tunnels (and so on) with the data packets, modifying headers of the data packets, encapsulation, decapsulation, adjusting a quality of service (QoS) and/or a guaranteed bit rate (GBR) of various data sessions, and other management functions. Further, the auxiliary processing component is configured to perform enhanced pipeline processing operations, which can include routing table lookups, matching bearers and/or destination nodes with associated information in routing tables, adjusting or encoding a QoS, GBR, etc., matching a header value with routing tables locally stored on the programmable network switch, and so on. In an exemplary embodiment, the auxiliary processing component (embedded on, for example, the FPGA) is configured to instruct the pipeline processing component (embedded on, for example, the ASIC) how to route the data packets. In an exemplary embodiment, a pipeline processing component may include a limited memory for configuration data (e.g. session data, tables, etc.) and limited space for packet buffering. Given that a single radio access network associated with, for example, access node 110, needs to actively support millions of sessions, there may be excessive communication of session data between the processing node and the pipeline processing component (on the ASIC/FPGA). Thus, inclusion of the auxiliary processing component (on another ASIC/FPGA with additional memory) enables enhanced pipeline processing. The auxiliary processing component can be configured with additional memory and logic for performing enhanced pipeline processing operations, thereby eliminating the need to transmit session data between the pipeline processing component and the host module.

For example, an FPGA configured as the auxiliary processing component can perform routing table lookups based on session data and on parsing packet headers, and append the session data to the packets prior to forwarding the data packets to a pipeline processing component configured on an ASIC or an FPGA. Additionally, the FPGA can include extra memory that can be used for buffering packets, e.g. for QoS traffic shaping purposes, versus dropping packets if the current traffic policy indicates that a packet cannot be forwarded at a given time due to policy limits being reached. In other words, the enhanced pipeline processing provided by the FPGA include at least QoS management and buffering and releasing data packets based on bandwidth availability and QoS thresholds. Thus, incorporating the auxiliary processing module on the FPGA can result in more effective bandwidth utilization with fewer dropped packets, faster packet processing (since the need to transmit updated session data from the processing node to the ASIC is eliminated) and a more flexible QoS implementation (with better bandwidth utilization and fewer dropped packets).

As further described herein, the pipeline processing component and/or the auxiliary processing component is configured to transport data packets between a wireless network and a packet data network (PDN). Wireless networks can include various additional types of networks, including radio access networks (RAN), backhaul networks, core networks, with each network including dedicated components and/or network nodes. For example, the network nodes comprise access nodes or wireless devices (on the RAN), one or more gateways or functions on the core network, or any other network node on the PDN, including but not limited to application servers, session management, proxy, web server, media server, or end-user wireless devices coupled to another wireless network or RAN. Therefore, exemplary programmable network switches described herein can include one or more ports that are associated with different reference points. For example, a programmable network switch can include a first set of ports associated with reference points for data transmission between different network nodes, and a second set of ports associated with reference points for control signal transmission between different network nodes. In an exemplary embodiment, a programmable network switch includes at least a port associated with the N3 reference point, which is used as a data input or output between the programmable network switch and a radio access network or access node within the radio access network. In an exemplary embodiment, a programmable network switch includes at least a port associated with the N6 reference point, which is used as a data input or output between the programmable network switch and a packet data network (PDN). In an exemplary embodiment, a programmable network switch includes at least a port associated with the N9 reference point, which is used as a data input or output between the programmable network switch and another programmable network switch, such as an intermediate UPF (iUPF) in 5G networks.

Further, in an exemplary embodiment, a programmable network switch includes at least a port associated with a control signal reference point, such as the N4 reference point, which is used as an input for control signals. For example, as described herein, a management module in a programmable network switch is configured to receive session information from a control gateway (SGW-C or PGW-C) or session management function (SMF), via the port associated with the N4 reference point. The control information received via the N4 reference point includes information related to provisioning a new session (e.g. using the packet forwarding control protocol (PFCP), quality of service information, billing information (including how and when to generate billing records), unique identifiers for a session, and so on. In an exemplary embodiment, information received via the N4 reference point enables the programmable network switch to perform session life cycle management. In an exemplary embodiment, in 4G networks, the port is associated with a S1-U or S5/S8-U interface or reference point. Further, a data management application executed on the processing node can use protocol independent switch architecture (PISA) and/or the P4 programming language.

In addition to the programmable network switches described herein, gateway node(s) 102 can include additional standalone computing device, computing systems, or network components, and can be accessible, for example, by a wired or wireless connection, or through an indirect connection such as through a computer network or communication network. For example, gateway node(s) 102 can additionally include a 4G CUPS gateway, such as any combination of a control-plane serving gateway (SGW-C), user-plane serving gateway (SGW-U), control-plane packet data network gateway (PGW-C), user-plane packet data network gateway (PGW-U), a 5G user plane function (UPF), etc. One of ordinary skill in the art would recognize that gateway node(s) 102 are not limited to any specific technology architecture, such as Long Term Evolution (LTE) or 5G NR, and can be used with any network architecture and/or protocol.

Gateway node(s) 102 can comprise a processor and associated circuitry to execute or direct the execution of computer-readable instructions to obtain information. Gateway node(s) 102 can retrieve and execute software from storage, which can include a disk drive, a flash drive, memory circuitry, or some other memory device, and which can be local or remotely accessible. The software comprises computer programs, firmware, or some other form of machine-readable instructions, and may include an operating system, utilities, drivers, network interfaces, applications, or some other type of software, including combinations thereof. Gateway node(s) 102 can receive instructions and other input at a user interface. Specific gateway node(s) 102 comprising processing nodes and programmable network switches are further described herein with reference to FIGS. 2-3.

Controller node 104 can be any network node configured to communicate information and/or control information over system 100. Controller node 104 can be a standalone computing device, computing system, or network component, and can be accessible, for example, by a wired or wireless connection, or through an indirect connection such as through a computer network or communication network. For example, controller node 104 can include a mobility management entity (MME), a session management function (SMF), an access and mobility function (AMF), a Home Subscriber Server (HSS), a Policy Control and Charging Rules Function (PCRF), an authentication, authorization, and accounting (AAA) node, a rights management server (RMS), a subscriber provisioning server (SPS), a policy server, etc. One of ordinary skill in the art would recognize that controller node 104 is not limited to any specific technology architecture, such as Long Term Evolution (LTE) or 5G NR, and can be used with any network architecture and/or protocol.

Controller node 104 can comprise a processor and associated circuitry to execute or direct the execution of computer-readable instructions to obtain information. Controller node 104 can retrieve and execute software from storage, which can include a disk drive, a flash drive, memory circuitry, or some other memory device, and which can be local or remotely accessible. In an exemplary embodiment, controller node 104 includes a database 105 for storing control information related to data sessions and data packets that traverse one or more gateway(s) 102. This information may be requested by or shared with gateway(s) 102, access node 110, and so on. The software comprises computer programs, firmware, or some other form of machine-readable instructions, and may include an operating system, utilities, drivers, network interfaces, applications, or some other type of software, and combinations thereof. Controller node 104 can receive instructions and other input at a user interface.

Communication network 101 can be a wired and/or wireless communication network, and can comprise processing nodes, routers, gateways, and physical and/or wireless data links for carrying data among various network elements, including combinations thereof, and can include a local area network a wide area network, and an internetwork (including the Internet). Communication network 101 can be capable of carrying data, for example, to support voice, push-to-talk, broadcast video, and data communications by wireless devices 120, etc. Wireless network protocols can comprise MBMS, code division multiple access (CDMA) 1×RTT, Global System for Mobile communications (GSM), Universal Mobile Telecommunications System (UMTS), High-Speed Packet Access (HSPA), Evolution Data Optimized (EV-DO), EV-DO rev. A, Third Generation Partnership Project Long Term Evolution (3GPP LTE), and Worldwide Interoperability for Microwave Access (WiMAX), Fourth Generation broadband cellular (4G, LTE Advanced, etc.), and Fifth Generation mobile networks or wireless systems (5G, 5G New Radio ("5G NR"), or 5G LTE). Wired network protocols that may be utilized by communication network 101 comprise Ethernet, Fast Ethernet, Gigabit Ethernet, Local Talk (such as Carrier Sense Multiple Access with Collision Avoidance), Token Ring, Fiber Distributed Data Interface (FDDI), and Asynchronous Transfer Mode (ATM). Communication network 101 can also comprise additional base stations, controller nodes, telephony switches, internet routers, network gateways, computer systems, communication links, or some other type of communication equipment, and combinations thereof. In an exemplary embodiment, communication network 101 includes a packet data network (PDN), such as the internet.

Communication links 106, 107 can use various communication media, such as air, space, metal, optical fiber, or some other signal propagation path—including combinations thereof. Communication links 106, 107 can be wired or wireless and use various communication protocols such as Internet, Internet protocol (IP), local-area network (LAN), optical networking, hybrid fiber coax (HFC), telephony, T1, or some other communication format—including combinations, improvements, or variations thereof. Wireless communication links can be a radio frequency, microwave, infrared, or other similar signal, and can use a suitable communication protocol, for example, Global System for Mobile telecommunications (GSM), Code Division Multiple Access (CDMA), Worldwide Interoperability for Microwave Access (WiMAX), Long Term Evolution (LTE), 5G NR, or combinations thereof. Communications links 106, 107 may include N1, N2, N3, N4, and N6 interfaces. Other protocols can also be used. Communication link 106 can be a direct link or might include various equipment, intermediate components, systems, and networks. Communication link 106 may comprise many different signals sharing the same link.

Access node 110 can be any network node configured to provide communication between wireless devices 120 and communication network 101, including standard access nodes and/or short range, low power, small access nodes. For instance, access node 110 may include any standard access node, such as a macrocell access node, base transceiver station, a radio base station, an eNodeB device, an enhanced eNodeB device, a next generation or gigabit NodeB device (gNBs) in 5G networks, or the like. In other embodiments, access node 110 can be a small access node including a microcell access node, a picocell access node, a femtocell access node, or the like such as a home NodeB or a home eNodeB device. By virtue of comprising a plurality of antennae as further described herein, access node 110 can deploy or implement different radio access technologies (RATs) such as 3G, 4G, 5G, sub-6G, mm-wave, as well as transmission modes including multiple-input-multiple-output (MIMO), single user MIMO (SU-MIMO), multi-user MIMO (MU-MIMO), etc.

Access node 110 can comprise a processor and associated circuitry to execute or direct the execution of computer-readable instructions to perform operations such as those further described herein. Briefly, access node 110 can retrieve and execute software from storage, which can include a disk drive, a flash drive, memory circuitry, or some other memory device, and which can be local or remotely accessible. The software comprises computer programs, firmware, or some other form of machine-readable instructions, and may include an operating system, utilities, drivers, network interfaces, applications, or some other type of software, including combinations thereof. Further, access node 110 can receive instructions and other input at a user interface. Access node 110 communicates with gateway node(s) 102 via communication link 106 and with controller node 104 via communication link 107. Access node 110 may communicate with other access nodes (not shown) using a direct link such as an X2 link or similar.

Wireless devices 120 may be any device, system, combination of devices, or other such communication platform capable of communicating wirelessly with access node 110 using one or more frequency bands deployed therefrom. Each of wireless devices 120 may be, for example, a mobile phone, a wireless phone, a wireless modem, a personal digital assistant (PDA), a voice over internet protocol (VoIP) phone, a voice over packet (VOP) phone, or a soft phone, as well as other types of devices or systems that can exchange audio or data via access node 110. Other types of communication platforms are possible.

Other network elements may be present in system 100 to facilitate communication but are omitted for clarity, such as base stations, base station controllers, mobile switching centers, dispatch application processors, and location registers such as a home location register or visitor location register. Furthermore, other network elements that are omitted for clarity may be present to facilitate communication, such as additional processing nodes, routers, gateways, and physical and/or wireless data links for carrying data among the various network elements, e.g. between access node 110 and communication network 101.

Further, the methods, systems, devices, networks, access nodes, and equipment described above may be implemented with, contain, or be executed by one or more computer systems and/or processing nodes. The methods described above may also be stored on a non-transitory computer readable medium. Many of the elements of communication system 100 may be, comprise, or include computers systems and/or processing nodes. This includes, but is not limited to: gateway node(s) 102, controller node 104, and/or network 101.

Figure 2:
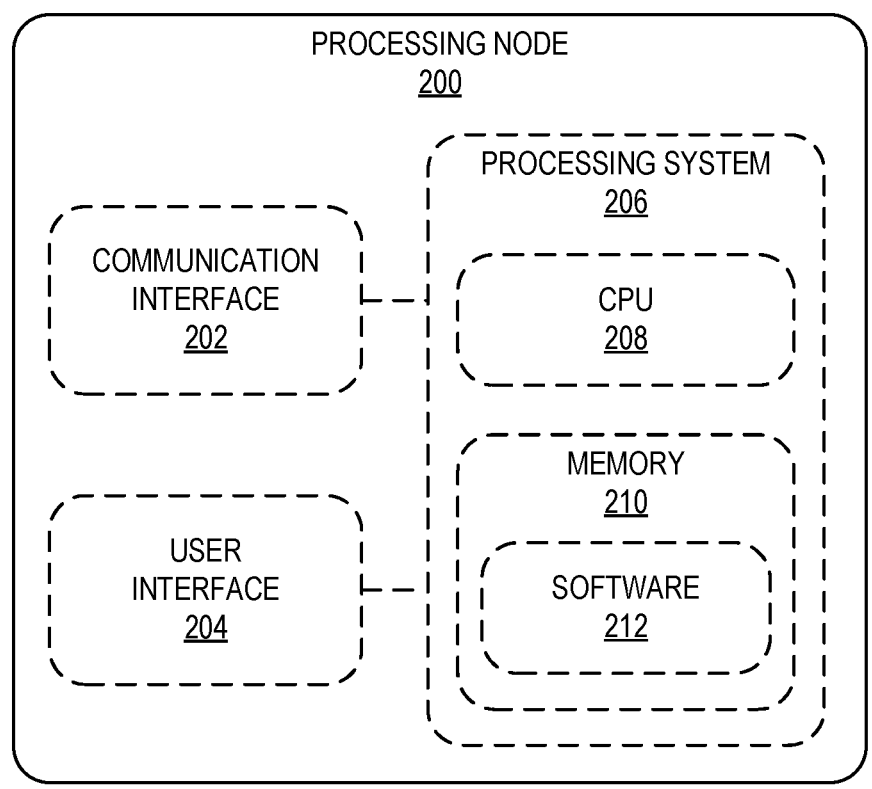
FIG. 2 depicts an exemplary processing node.

FIG. 2 depicts an exemplary processing node 200. The processing node 200 includes a communication interface 202, user interface 204, and processing system 206 in communication with communication interface 202 and user interface 204. Processing system 206 includes storage 208, which can comprise a disk drive, flash drive, memory circuitry, or other memory device. Storage 208 can store software 210 which is used in the operation of the processing node 200. Storage 208 may include a disk drive, flash drive, data storage circuitry, or some other memory apparatus. Software 210 may include computer programs, firmware, or some other form of machine-readable instructions, including an operating system, utilities, drivers, network interfaces, applications, or some other type of software. Processing system 206 may include a microprocessor and other circuitry to retrieve and execute software 210 from storage 208. Processing node 200 may further include other components such as a power management unit, a control interface unit, etc., which are omitted for clarity. Communication interface 202 permits processing node 200 to communicate with other network elements. User interface 204 permits the configuration and control of the operation of processing node 200.

Figure 3:
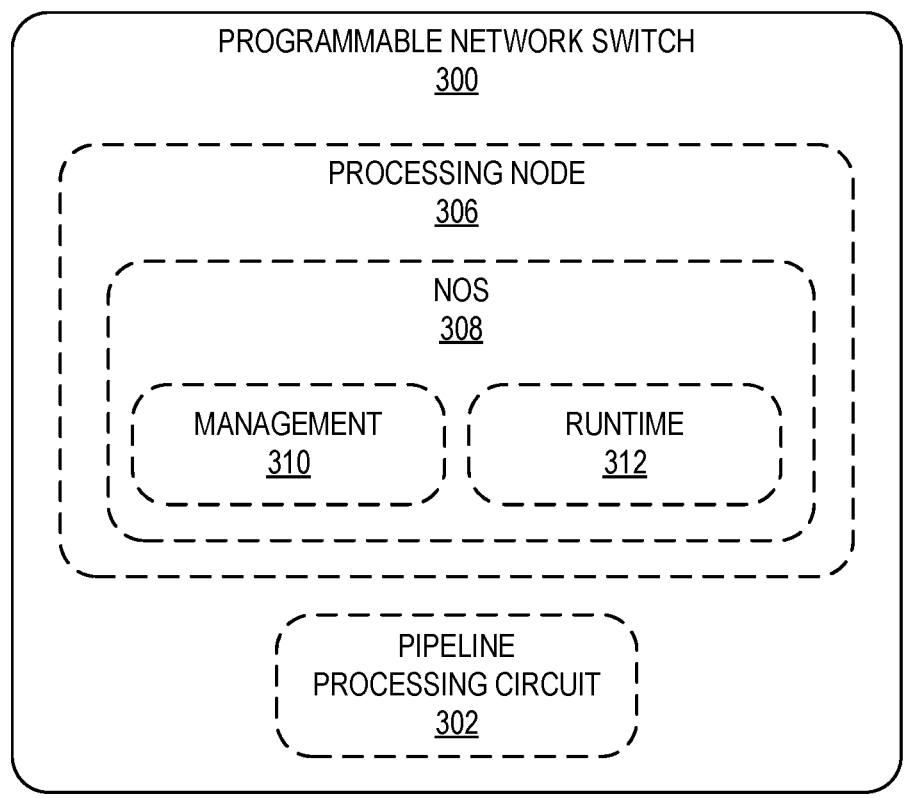
FIG. 3 depicts an exemplary programmable network switch comprising a pipeline processing circuit and a processing node.

In an exemplary embodiment, processing node 200 is physically and electrically coupled to a pipeline processing component and/or an auxiliary processing component, as further described in FIG. 3. Generally, the software 210 of processing node 200 can be configured to perform data management functions including communicating with other network components, such as a controller node, managing health of different network nodes such as eNodeBs, gNodeBs, other components of a UPF, or any network node along the data path, as well as tunnel identification management, session identifier management, and so on. In exemplary embodiments, the programmable network switch receives control-plane instructions from a session management function (SMF), a mobility management entity (MME), or any other controller node, via a control gateway such as a SGW-C. Based on the instructions from the controller node, the processing node 200 can instruct a pipeline processing component and/or an auxiliary processing component on how to process the data sessions associated with the data packets received thereat. For example, the processing node 200 (which is configured as a host and includes a management module as further described herein)

can provide session data to a pipeline processing component and/or an auxiliary processing component coupled thereto, as well as update routing tables, receive statistics, process exceptions, etc.

FIG. 3 depicts an exemplary programmable network switch 300. Programmable network switch 300 includes a processing node 306 configured to execute a network operating system (hereinafter, NOS 308), and a pipeline processing circuit 302. Processing node 306 can be similar to processing node 200 described in FIG. 2, and may further include components such as a processor and memory that are not shown herein. NOS 308 may be utilized to execute applications and/or other modules such as a management module 310 and a runtime module 312. The NOS 308 may be based on the Open Network Linux (ONL) system. Management module 310 is configured to perform data management operations including session management, and to provide session data and updated routing table information to pipeline processing circuit 302 via runtime module 312. Management module 310 may receive control-plane instructions via management module 310 from a session management function (SMF), a gateway control plane (SGW-C, PGW-C, or SAEGW-C), or a controller node. Pipeline processing circuit 302 is configured to perform pipeline processing operations as described herein, including modifying data packet headers based on session data received from processing node 306, and transporting data packets to different network nodes. The processing node 306 and pipeline processing circuit 302 are combined into a single housing of the programmable network switch 300, such as a rack-mounted unit. Providing a programmable network switch 300 with multiple different functions that interface with each other within a single unit preserves network resources such as power, bandwidth, etc.

In an exemplary embodiment, the pipeline processing circuit 302 is embedded on an ASIC within programmable network switch 300. For example, the pipeline processing circuit can include any end-user switch chip, such as the TOFINO® or TOFINO2® chip manufactured by BAREFOOT NETWORKS®, or the SILICONE ONE® manufactured by CISCO SYSTEMS INC.®. The pipeline processing circuit 302 may utilize a protocol independent switch architecture (PISA), and may be partly programmable via the P4 programming language. The pipeline processing circuit 302 may send and receive data to the processing node 306 via runtime module 312 residing on processing node 306, as further illustrated in FIG. 4. Further, programmable network switch 300 includes one or more ports that are associated with different reference points, or configured to communicate with different network nodes such as access nodes or wireless devices (on the RAN), one or more gateways or functions on the core network, or any other network node on the PDN, including but not limited to application servers, session management, proxy, web server, media server, or end-user wireless devices coupled to another wireless network or RAN. For example, a programmable network switch can include a first set of ports associated with reference points for data transmission between different network nodes, and a second set of ports associated with reference points for control signal transmission between different network nodes. In an exemplary embodiment, a programmable network switch includes at least a port associated with the N3 reference point, which is used as a data input or output between the programmable network switch and a radio access network or access node within the radio access network. In an exemplary embodiment, a programmable network switch includes at least a port associated with the N6 reference point, which is used as a data input or output between the programmable network switch and a packet data network (PDN). In an exemplary embodiment, a programmable network switch includes at least a port associated with the N9 reference point, which is used as a data input or output between the programmable network switch and another programmable network switch, such as an intermediate UPF (iUPF) in 5G networks. Further, in an exemplary embodiment, a programmable network switch 300 includes at least a port associated with a control signal reference point, such as the N4 reference point, which is used as an input for control signals. For example, as described herein, a management module in a programmable network switch is configured to receive session information from a control gateway (SGW-C or PGW-C) or session management function (SMF), via the port associated with the N4 reference point. The control information received via the N4 reference point includes information related to provisioning a new session (e.g. using the packet forwarding control protocol (PFCP), quality of service information, billing information (including how and when to generate billing records), unique identifiers for a session, and so on. In an exemplary embodiment, information received via the N4 reference point enables the programmable network switch to perform session life cycle management. In an exemplary embodiment, in 4G networks, the port is associated with a S1-U or S5/S8-U interface or reference point. Further, a data management application executed on the processing node can use protocol independent switch architecture (PISA) and/or the P4 programming language.

Figure 4:
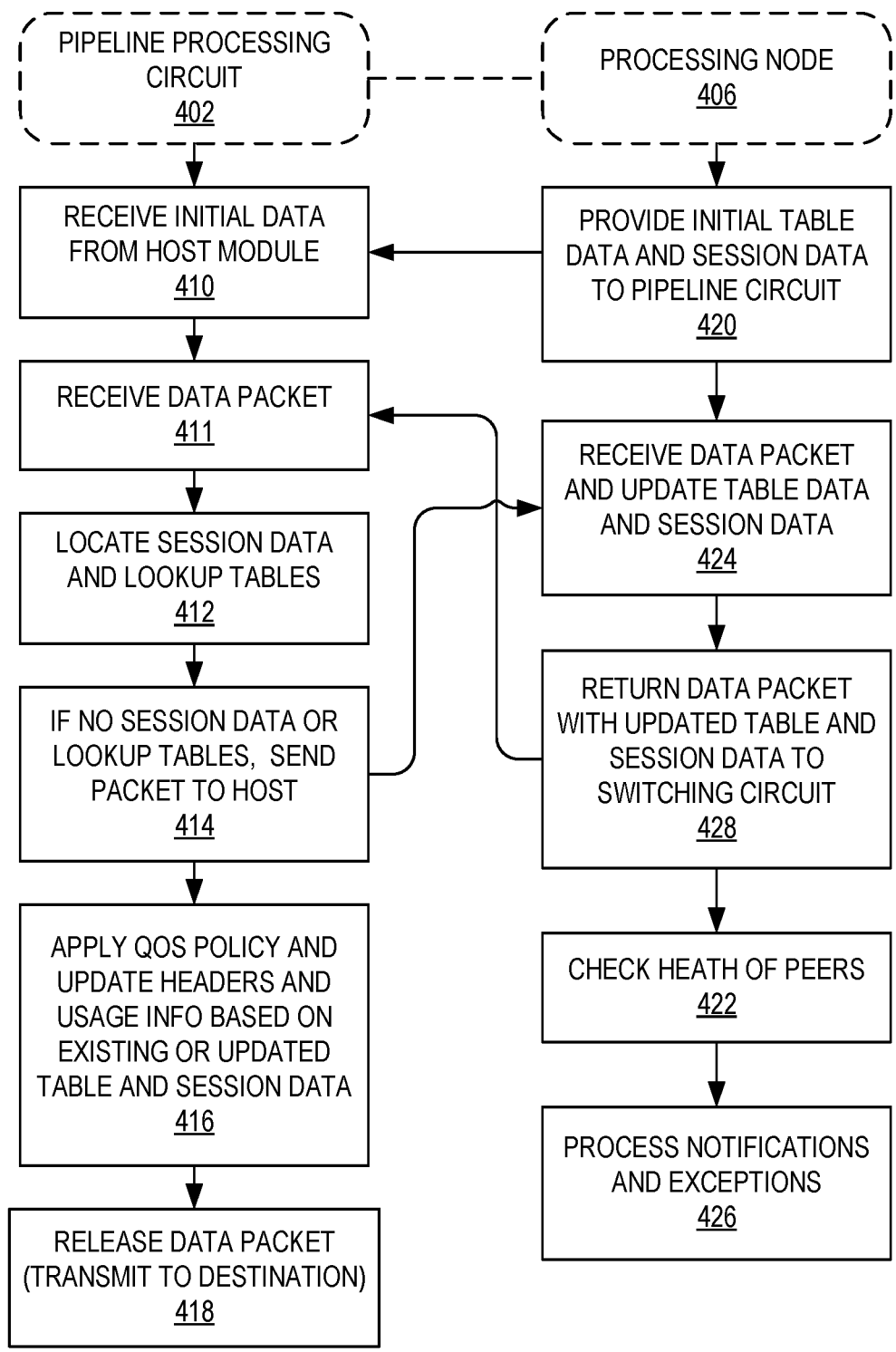
FIG. 4 depicts exemplary operations performed by a programmable network switch comprising a pipeline processing circuit and a processing node.

FIG. 4 depicts operations performed by a pipeline processing circuit 402 and a processing node 406 of a programmable network switch, such as programmable network switch 300 depicted in FIG. 3. The pipeline processing circuit 402 and the processing node 406 may be enclosed within a "white box switch" with the processing node 406 executing a data management application on a network operating system (NOS), using a processor (such as, for example, an X86 processor), and the pipeline processing component embedded into a hardware chip, such as an application-specific integrated circuit (ASIC) or a field-programmable gate array (FPGA). The ASIC/FPGA may be configured to perform pipeline processing of data packets based on information received from the processing node 406 via, for example, a runtime module within a NOS. Although FIG. 4 depicts steps performed in a particular order for purposes of illustration and discussion, the operations discussed herein are not limited to any particular order or arrangement. One skilled in the art, using the disclosures provided herein, will appreciate that various steps of the methods can be omitted, rearranged, combined, and/or adapted in various ways.

For example, as illustrated herein, at 410, the pipeline processing circuit 402 can receive initial data including table data and session data from the management module on processing node 406. This information can include details regarding how the data packets received at the programmable network switch and associated with a particular session are to be manipulated. The information can further include routing tables, service data filters (SDF), etc. For example, in LTE networks, user traffic (IP flows or IP packets) is classified into SDF traffic and EPS bearer traffic (hereinafter referred to as "EPS bearer"). SDF refers to a group of IP flows associated with a service that a user is using, while an EPS bearer refers to IP flows of aggregated SDFs that have the same QoS class. The SDF and EPS bearer are detected by matching the IP flows against the packet filters (SDF templates for SDFs or traffic flow templates (TFTs) for EPS bearers). These packet filters are auxiliary configured by network operators in accordance with their policy, and each of them typically consists of 5-tuple (Source IP address, Destination IP address, Source port number, Destination port number, and Protocol ID). Further, other common resources are transmitted at 410-420 that are referenced in individual session configurations or are used for specific transformations. Specific transformations can include, for example, modifying a destination MAC address in the header of a data packet, which reflects the "next hop" that the data packet will be sent to.

Thus when the data packet (associated with a session) is received at 411 at the pipeline processing circuit 402, the session data associated with the data packet and lookup tables are referenced at 412, to determine how to process or the data packet. If no session data or lookup tables are found associated with the data packet, then the data packet is transmitted to the management module on processing node 406. For example, due to limited memory coupled to the pipeline processing circuit 402, the initial table data and session data may be out of date or unrelated to the current session. Thus, the data packet is sent to the processing node 406 where, at 424, the management application performs a lookup in a memory of the processing node 406 for the session configuration data. Upon retrieving the updated session data associated with the session at 424, the data packet is returned with updated session data at 428 to the pipeline processing circuit 402. It is also possible that a data packet may be buffered at the processing node at 414 as it relates to QoS policy enforcement, or for traffic shaping purposes. Thus, upon receipt of the data packet with updated session data at 411, the pipeline processing circuit 402 again locates the session data and lookup tables at 412 that have been updated based on step 428. Pipeline processing circuit 402 can then apply the QoS policy and update headers and usage information for the data packet at 416, and release the data packet at 418. Releasing the data packet at 418 can include transmitting the data packet to a destination node based on the updated headers, or to another network node for further pipeline processing.

Meanwhile, a host or management module on processing node 406 can be configured to perform additional operations, including communicating with other network components, such as a controller node, monitoring statistical information from pipeline processing circuit 402, managing health of different network nodes at 422, such as eNodeBs, gNodeBs, other components of a UPF, or any network node along the data path, as well as processing notifications and exceptions 426. Processing notifications and exceptions 426 can be performed on an ongoing basis, independent of whether or not data packets are being processed by pipeline processing circuit 402. Checking health of peers 422 can include transmitting echo request packets and receiving echo response packets to and from different network nodes. These echo request and response packets (in the form of, for example, GTP packets) are also received at the pipeline processing circuit 402 and transmitted to the processing node 406 at 414. For example, the echo request and response packets may include a specific header responsive to which the packets are sent to the processing node 406. The echo request and response packets can be associated with different network nodes, and different data sessions for which other data packets are received at the programmable network switch. Based on whether or not echo response packets are received, the data sessions may be taken down, or re-homed (directed to a different network node). Thus, while existing implementations of CUPS and UPFs have this type of peer health checks being performed at an external host server, which can cause excessive communication between host servers and switches. In contrast, the disclosed embodiments minimize these operations and processing by incorporating the processing node 406 into the programmable network switch, enabling the health checks 422 to be performed in real-time without excessive signaling/transmission being performed by the switch itself.

As described herein, a pipeline processing component may include a limited memory for configuration data (e.g. session data, tables, etc.) and limited space for packet buffering. Given that a single radio access network needs to actively support millions of sessions, there may be excessive communication of session data between the host module and the pipeline processing component (on the ASIC). Thus, inclusion of the auxiliary processing component (on the FPGA) provides additional processing power and memory to the pipeline processing.

Figure 5:
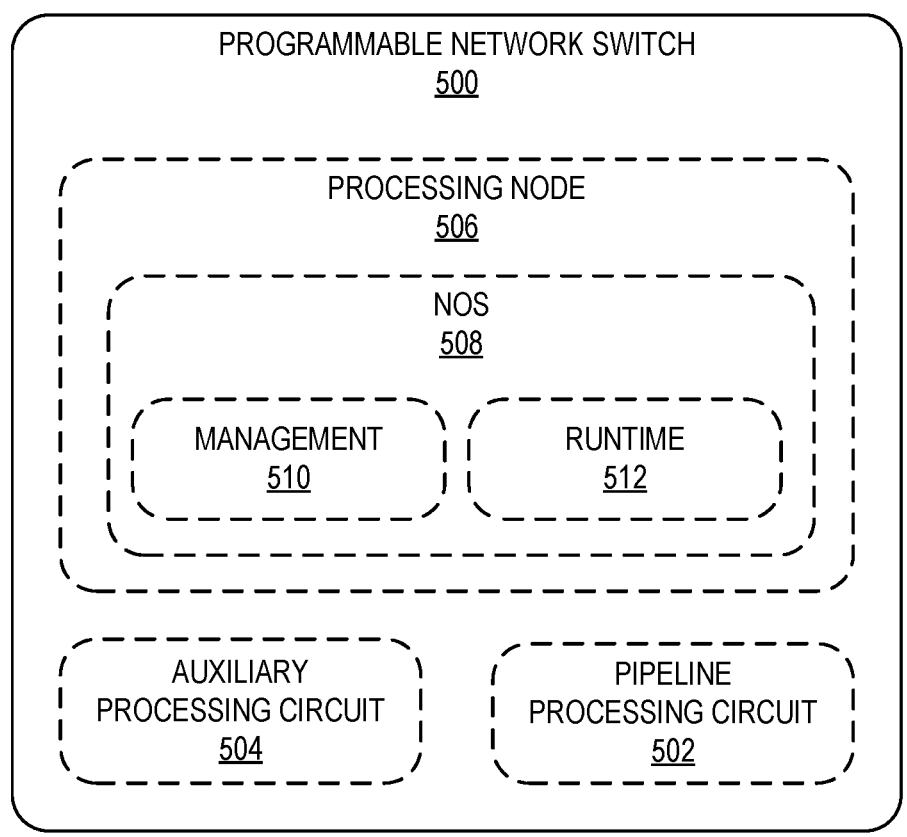
FIG. 5 depicts an exemplary programmable network switch comprising an auxiliary processing circuit, a pipeline processing circuit, and a processing node.

FIG. 5 depicts an exemplary programmable network switch 500 including an auxiliary processing circuit 504, along with a processing node 506 and a pipeline processing circuit 502. Similarly to programmable network switch 300 described above, processing node 506 can be similar to processing node 200 described in FIG. 2, and may further include components such as a processor and memory that are not shown herein. NOS 508 may be utilized to execute applications and/or other modules within processing node 506, such as a data management module (or application) 510 and a runtime module 512. Management module 510 is configured as a user plane proxy, and can perform data management operations including session management, and to provide session data and updated routing table information to pipeline processing module 502 via runtime module 512. Management module 510 may receive control-plane instructions from a session management function (SMF), a gateway control plane (SGW-C, PGW-C, or SAEGW-C), or a controller node.

Pipeline processing circuit 502 is configured to perform pipeline processing operations as described herein, including modifying data packet headers based on session data received from management application 510, and transporting data packets to different network nodes. The processing node 506 and pipeline processing circuit 502 are combined into a single housing of the programmable network switch 500, such as a rack-mounted unit. Providing a programmable network switch 500 with multiple different functions that interface with each other within a single unit preserves network resources such as power, bandwidth, etc. In an exemplary embodiment, the pipeline processing circuit 502 is embedded on an ASIC within programmable network switch 500. For example, the pipeline processing circuit can include any end-user switch chip, such as the TOFINO® or TOFINO2® chip manufactured by BAREFOOT NETWORKS®. The pipeline processing circuit 502 may utilize a protocol independent switch architecture (PISA), and may be partly programmable via the P4 programming language. The pipeline processing circuit 502 may send and receive data to the processing node 506 via runtime module 512 residing on NOS 508, as further illustrated in FIG. 6. Further, programmable network switch 500 includes one or more ports that are associated with different reference points, or configured to communicate with different network nodes such as access nodes or wireless devices (on the RAN), one or more gateways or functions on the core network, or any other network node on the PDN, including but not limited to application servers, session management, proxy, web server, media server, or end-user wireless devices coupled to another wireless network or RAN. For example, a programmable network switch can include a first set of ports associated with reference points for data transmission between different network nodes, and a second set of ports associated with reference points for control signal transmission between different network nodes. In an exemplary embodiment, a programmable network switch includes at least a port associated with the N3 reference point, which is used as a data input or output between the programmable network switch and a radio access network or access node within the radio access network. In an exemplary embodiment, a programmable network switch includes at least a port associated with the N6 reference point, which is used as a data input or output between the programmable network switch and a packet data network (PDN). In an exemplary embodiment, a programmable network switch includes at least a port associated with the N9 reference point, which is used as a data input or output between the programmable network switch and another programmable network switch, such as an intermediate UPF (iUPF) in 5G networks. Further, in an exemplary embodiment, a programmable network switch 500 includes at least a port associated with a control signal reference point, such as the N4 reference point, which is used as an input for control signals. For example, as described herein, a management module in a programmable network switch is configured to receive session information from a control gateway (SGW-C or PGW-C) or session management function (SMF), via the port associated with the N4 reference point. The control information received via the N4 reference point includes information related to provisioning a new session (e.g. using the packet forwarding control protocol (PFCP), quality of service information, billing information (including how and when to generate billing records), unique identifiers for a session, and so on. In an exemplary embodiment, information received via the N4 reference point enables the programmable network switch to perform session life cycle management. In an exemplary embodiment, in 4G networks, the port is associated with a S1-U or S5/S8-U interface or reference point. Further, a data management application executed on the processing node can use protocol independent switch architecture (PISA) and/or the P4 programming language.

Further, the auxiliary processing circuit 504 may be constructed or "baked" in combination with pipeline processing circuit 502 and processing node 506, to enable seamless operation and communication therebetween, using the appropriate interfaces, runtime modules, and programmable instructions. In particular, coupling the auxiliary processing circuit 504 with the pipeline processing circuit 502 enables programmable network switch 500 to be able to process a very large variety and number of data sessions. Despite pipeline processing circuits such as the TOFINO2 featuring programmable pipelines and storage of packet lookup tables, the memory onboard such ASICs is not sufficient to handle the volume and diversity of data associated with modern wireless networks. In an exemplary embodiment, pipeline processing circuit 502 comprises a TOFINO2® ASIC with 22 megabytes (MB) of memory, while the auxiliary processing circuit 504 comprises a FPGA with 8 gigabytes (GB) of memory. The added memory and pre-processing and post-processing functionality of the auxiliary processing circuit 504 enables enhanced pipeline processing of data packets in real time, such that pipeline processing circuit 502 is enabled to accurately and effectively transport the data packets to various network nodes. This eliminates the need for extraneous communication between a switch and an external host server.

Specifically, the auxiliary processing circuit 504 is configured to perform enhanced pipeline processing operations, which can include routing table lookups, matching bearers and/or destination nodes with associated information in routing tables, adjusting or encoding a QoS, GBR, etc., matching a header value with routing tables locally stored on the programmable network switch 500, and so on. In an exemplary embodiment, the auxiliary processing circuit 504 is embedded on an FPGA within programmable network switch 500. For example, the auxiliary processing circuit 504 may comprise any programmable hardware circuit, such as an integrated circuit (IC), that may be programmed to carry out one or more logical operations as further described herein. The FPGA may comprise, for instance, one or more programmable logic gates and a memory for storing instructions enabling the use of single AND/OR functions to more complex functions that enable use of the FPGA as a comprehensive multi-core processor. Generally, FPGAs can be optimized for particular workloads, e.g. video and imaging, to circuitry for computer, auto, aerospace, and military applications, in addition to electronics for specialized processing and more. FPGAs are particularly useful for prototyping ASICs or processors, and combined with other circuits and/or processing systems or nodes, such as pipeline processing components further described herein. Thus exemplary FPGAs described herein, including auxiliary processing circuit 504, can be optimized to perform packet routing, routing table lookups, etc.

In an exemplary embodiment, the auxiliary processing component 504 (embedded on, for example, the FPGA) is configured to instruct the pipeline processing component 502 (embedded on, for example, the ASIC) how to route the data packets. The auxiliary processing component 504 is configured with additional memory and logic for performing pipeline processing operations, thereby eliminating the need to transmit session data between the pipeline processing component 502 and the host module. For example, the auxiliary processing component 504 can perform routing table lookups based on session data and on parsing packet headers, and append the session data to the packets prior to forwarding the data packets to the pipeline processing component 502. In an exemplary embodiment, a custom header may be appended onto a packet, including additional or updated configuration data, which is received at the pipeline processing component 504. The custom header can include an indication enabling pipeline processing component 502 to extract the updated information and process it similarly to performing a lookup in its local memory for session/configuration data that is used for pipeline processing. Thus, the extra memory of the auxiliary processing component 504 provides enhanced pipeline processing by enabling faster lookups for configuration data at the pipeline processing component 502, which minimizes the need for excessive updates between the pipeline processing component and the management module as presented in the previous embodiments. Further advantages of the memory of the auxiliary processing component 504 include monitoring usage data associated with users of certain data sessions, i.e. how many bytes, what size of data packets used by a user, etc. For example, the memory of the auxiliary processing component 504 can be configured with usage counters, which are updated as part of the post-processing operations (when the data packet is received back from the pipeline processing component 502). Whereas the limited memory of the pipeline processing component 502 may need to be reserved for operations specific to pipeline processing, the auxiliary processing component 504 can be used to perform enhanced processing including collecting data usage and reporting it back to the data management module, which can in turn submit the information to other components for usage, billing, and other purposes.

Additionally, the auxiliary processing component 504 can include extra memory that can be used for buffering packets, e.g. for QoS traffic shaping purposes, versus dropping packets if the current traffic policy indicates that a packet cannot be forwarded at a given time due to policy limits being reached. In other words, the enhanced pipeline processing provided by the auxiliary processing component 504 include at least QoS management and buffering and releasing data packets based on bandwidth availability and QoS thresholds. Buffering data packets at the auxiliary processing component 504 is more efficient than the processing node 506 performing the buffering, since it eliminates the need to transmit the data packets from the pipeline processing module 502 to the processing node 506 and back. Thus, incorporating the auxiliary processing component 504 into the programmable network switch 500 can result in more effective bandwidth utilization with fewer dropped packets, faster packet processing (since the need to transmit updated session data from the management application 510 to the pipeline processing component 502 is eliminated) and a more flexible QoS implementation (with better bandwidth utilization and fewer dropped packets).

As described herein, the auxiliary processing circuit 504 is configured to perform a plurality of operations related to enhanced pipeline processing of data packets and data sessions. For example, data packets are routed (within programmable network switch 500) from auxiliary processing circuit 504 to pipeline processing circuit 502 and then back to auxiliary processing circuit 504 to be transported to the appropriate destination, as further described with reference to FIG. 6. For example, auxiliary processing circuit 504 is configured to modify metadata of a data packet, add or remove values to headers of different packets passing via a routing pipeline of auxiliary processing circuit 504, referring to access control lists (ACL) in order to identify appropriate bearers etc. for different data packets, and so on. Auxiliary processing circuit 504 may further be configured to receive routing information from processing node 506, which in turn may receive information from external hosts via management module 510, or any other source. The data packets with modified headers and/or metadata may be transmitted from auxiliary processing circuit 504 to pipeline processing circuit 502. Thus, performing packet processing at an auxiliary processing circuit 504 coupled directly to a pipeline processing circuit 502 enables real-time pipeline or in-line processing of data packets that traverse the programmable network switch 500. This real-time processing offers many benefits to operators of communications networks, primarily with regards to performance and efficiency.

Processing node 506 further includes components that are not shown herein, but understood as being necessary to execute the NOS and the aforementioned modules, such as a memory, a processor, and other components as previously described with reference to FIG. 2. For example, the NOS 508, management module 510, and runtime module 512, among other modules, may be stored on a memory and executed by a general-purpose processor (such as an X86 processor) within processing node 506. Meanwhile, runtime module 512 can also include an interoperability module to interface with auxiliary processing circuit 504. For example, the interoperability module may comprise a FPGA interoperability module. In addition, runtime module 512 is configured to interface with and direct operation of pipeline processing circuit 502. For example, in the event that the pipeline processing circuit comprises a TOFINO® or TOFINO2® ASIC using the P4 programming language, runtime module 512 comprises a P4 runtime module. In other embodiments, runtime module 512 may comprise any generic interface to configure or any runtime values running on the pipeline processing circuit 502.

Further, management module 510 is configured to perform additional management functions including provisioning of data sessions, communicating with other network components, such as a controller node, managing health of different network nodes such as eNodeBs, gNodeBs, and other components or network nodes associated with the user plane or along the data path, as well as tunnel identification management, session identifier management, and so on. In an exemplary embodiment, the management module 510 receives control-plane instructions from a session management function (SMF), a mobility management entity (MME), or any other controller node that is communicably coupled to programmable network switch 500. Based on the instructions from the controller node, the management module 510 can determine how to process the data sessions associated with the data packets it receives from pipeline processing circuit 502 or auxiliary processing circuit 504. Based on these determinations, the management module 510 can instruct the pipeline processing circuit 502 and/or auxiliary processing circuit 504 with regards to how to route or transport the data packets associated with the data sessions, as further illustrated in FIG. 6.

Figure 6:
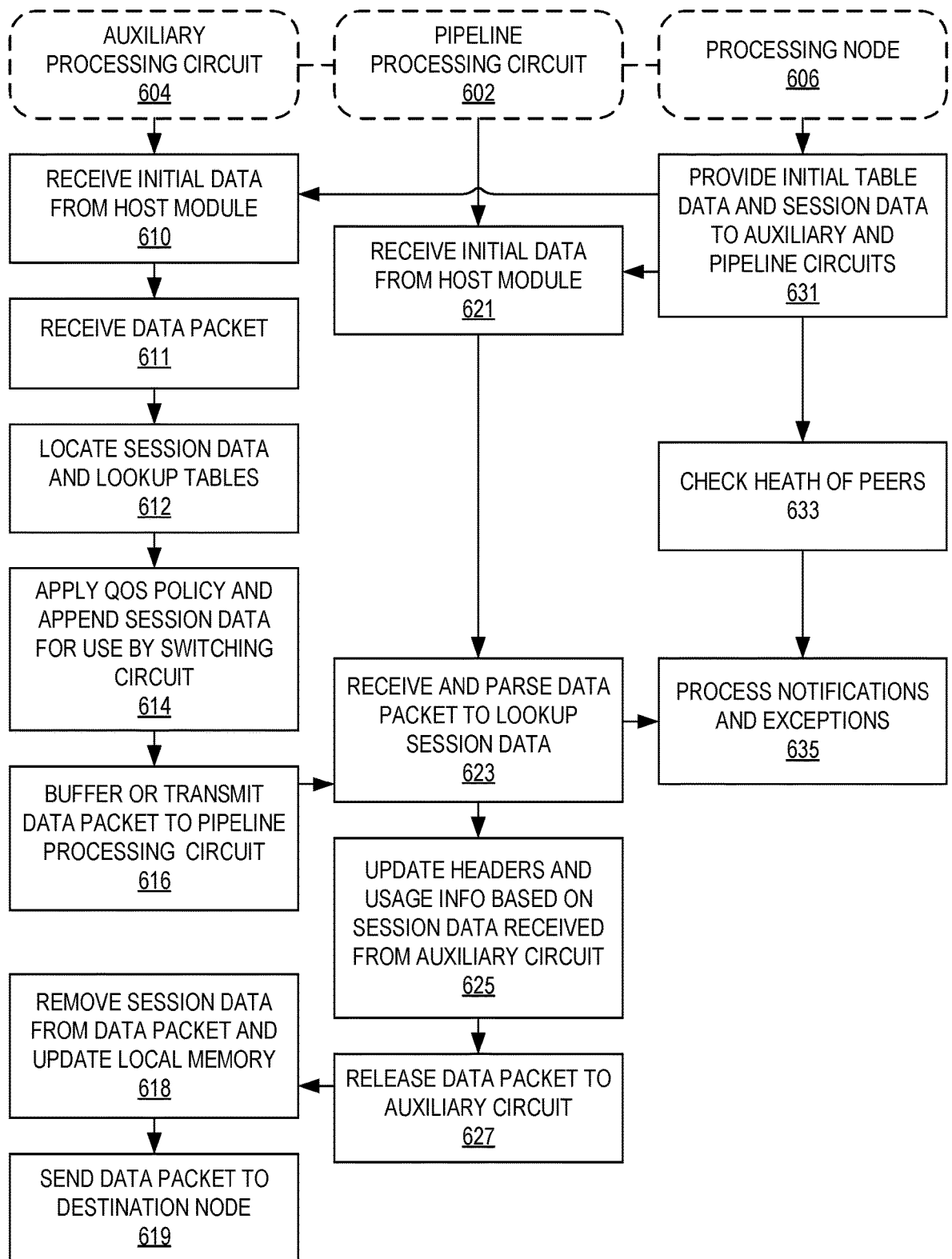
FIG. 6 depicts exemplary operations performed by a programmable network switch comprising an auxiliary processing circuit, a pipeline processing circuit, and a processing node.

FIG. 6 depicts operations performed by an auxiliary processing circuit 604, pipeline processing circuit 602, and a processing node 606 of a programmable network switch, such as programmable network switch 500 depicted in FIG. 5. The auxiliary processing circuit 604, pipeline processing circuit 602, and processing node 606 may be enclosed within a "white box switch" with the processing node 606 executing a data management application on a network operating system (NOS), using a processor (such as, for example, an X86 processor), the auxiliary processing circuit 604 embedded into a hardware chip such as an FPGA having at least a processor and a memory, and the pipeline processing circuit 602 embedded into a hardware chip such as an ASIC. Although FIG. 6 depicts steps performed in a particular order for purposes of illustration and discussion, the operations discussed herein are not limited to any particular order or arrangement. One skilled in the art, using the disclosures provided herein, will appreciate that various steps of the methods can be omitted, rearranged, combined, and/or adapted in various ways.

For example, as illustrated herein, at 610, the auxiliary processing circuit 604 and pipeline processing circuit 602 can receive initial data including table data and session data from the host or management module residing on processing node 606. This information can include details regarding how the data packets received at the programmable network switch and associated with a particular session are to be manipulated. The information can further include routing tables, service data filters (SDF), etc. For example, in LTE networks, user traffic (IP flows or IP packets) is classified into SDF traffic and EPS bearer traffic (hereinafter referred to as "EPS bearer"). SDF refers to a group of IP flows associated with a service that a user is using, while an EPS bearer refers to IP flows of aggregated SDFs that have the same QoS class. The SDF and EPS bearer are detected by matching the IP flows against the packet filters (SDF templates for SDFs or traffic flow templates (TFTs) for EPS bearers). These packet filters are pre-configured by network operators in accordance with their policy, and each of them typically consists of 5-tuple (Source IP address, Destination IP address, Source port number, Destination port number, and Protocol ID). Further, other common resources are transmitted at 631, 621, and 610 that are referenced in individual session configurations or are used for specific transformations.

Thus when the data packet (associated with a session) is received at 611 at the auxiliary processing circuit 604, the session data associated with the data packet and lookup tables are referenced at 612, to determine how to process or the data packet. Unlike the previous embodiment of FIGS. 3-4, the data packet need not be transmitted to the host or management module residing on processing node 606, since the auxiliary processing circuit 604 is configured with sufficient memory to host session configuration data. In other words, the programmable network switch is configured to first receive the data packet at the auxiliary processing circuit 604 (e.g. an FPGA), then transmit the data packet to the pipeline processing circuit 602 (e.g. an ASIC), and then again to the auxiliary processing circuit 604 for any post processing before the packet is sent to the destination port on the switch. This stands in contrast to the embodiment of FIGS. 3-4, where the functions that are shown to be performed by the auxiliary processing circuit 604 are handled by a combination of the pipeline processing circuit 402 and the processing node 406.

Referring back to FIG. 6, at 614, the auxiliary processing circuit 604 can apply the QoS policy and append session data, and transmit the data packet to the pipeline processing circuit 602 at 616, or buffer the data packet in a memory of the auxiliary processing circuit 604. At 623, pipeline processing circuit 602 receives the data packet and parses the data packet to lookup session data received from processing node 606. At 625, pipeline processing circuit 602 updates headers and usage information for the data packet, and releases the data packet at 627 to the auxiliary processing module 604. At 618, auxiliary processing module 604 removes the session data from the data packet, updates its local memory, and at 619, transmits the data packet to a destination node based on the updated headers, or to another network node for further pipeline processing. Meanwhile, processing node 606 can be configured to perform additional operations, including communicating with other network components, such as a controller node, monitoring statistical information from pipeline processing circuit 602 and/or auxiliary processing circuit 604, managing health of different network nodes at 633, such as eNodeBs, gNodeBs, other components of a UPF, or any network node along the data path, as well as processing notifications and exceptions 635.

As depicted below with references to FIGS. 7-9, programmable network switches can replace the myriad components of existing 4G CUPS gateways and 5G UPFs, and may similarly be positioned or located at various points within a network topology depending on a network operator's requirement. In an exemplary embodiment, a programmable network switch as described herein can be co-located with an access node, such as a gNodeB or eNodeB, such that data flows may directly egress from the user plane at the radio access network (RAN) to the destination network. This eliminates having to transport the data packets to central sites or networks.

Figure 7:
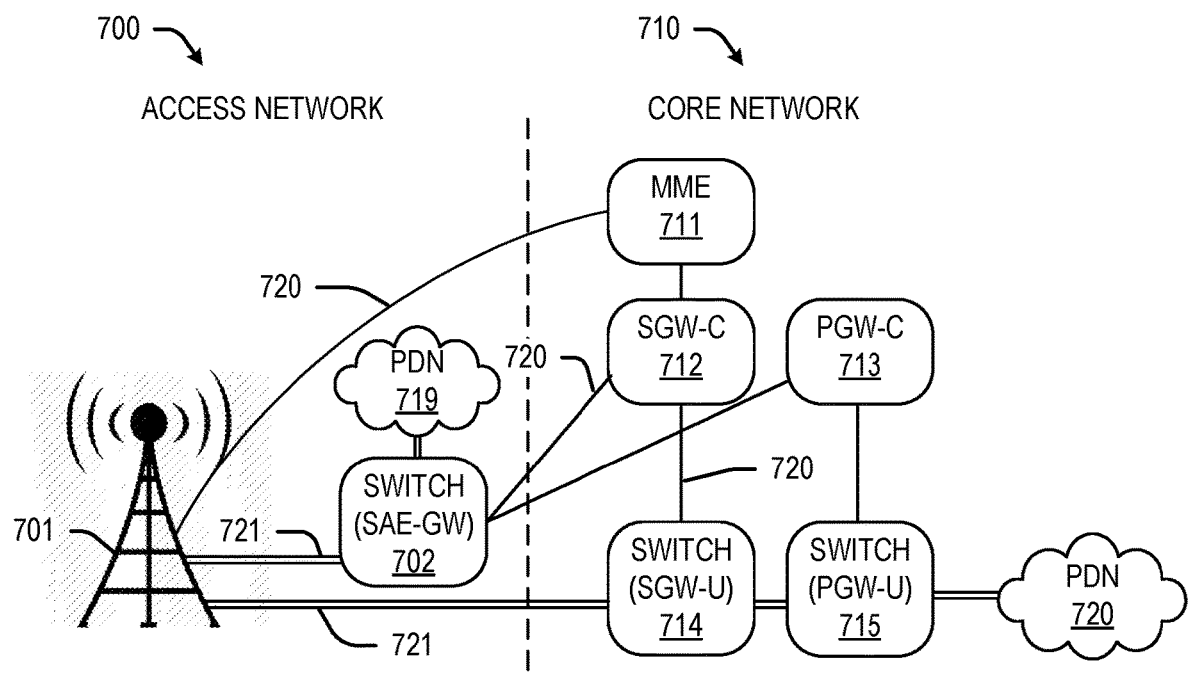
FIG. 7 depicts an exemplary programmable network switch implemented in a 4G system.

FIG. 7 depicts components of an exemplary 4G LTE radio access network 700 and core network 710. The components of access network 700 include at least an access node 701 and a programmable network switch 702. Access node 701 can include an eNodeB, and may function similarly to access node 110 described in FIG. 1. Further, the programmable network switch 702 can be similar to the programmable network switches 300, 500 described in FIGS. 3, 5 respectively. For example, programmable network switch 702 can include a "white box switch" that executes a network operating system (NOS) using a processor (such as, for example, an X86 processor) and coupled to a pipeline processing component embedded into a hardware chip, such as an application-specific integrated circuit (ASIC) or FPGA. The ASIC/FPGA may be configured as a network switch and may receive instructions from the NOS, and may further include its own operating system (OS) which interfaces with the NOS. Such a programmable network switch may comprise multiple hardware circuits and software modules associated with the different types of functions, all of which are incorporated into a single hardware unit, such as a rack-mountable unit. Data packets associated with data sessions are routed through a "pipeline" comprising these circuits and modules, such that the different types of functions are configured to perform "pipeline processing" of the data packets in real time, and without the excessive signaling and transmission required by prior-art configurations of control and data gateways. Specifically, data packets traverse access network 700 and core network 710 via the user plane 721, while control signals are transmitted across access network 700 and core network 710 via the control plane 720.

Mobility management entity (MME) 711 can be a control node for 4G networks, as it is configured to manage network access and mobility for wireless devices attached to access node 701, as well as establish bearer paths the wireless devices. The MME 711 is also responsible for bearer activation/deactivation process. In addition, it is responsible for selecting the serving gateway (S-GW) for a wireless devices at the initial attach and at time of a handover. Further, the MME 711 can authenticate users and generate and allocate temporary identities to wireless devices. The MME 711 also controls mobility between LTE and 2G/3G access networks, and controls other network elements, by means of signaling messages that are internal to the core network 710.

In this exemplary embodiment, programmable network switches may be incorporated on the radio access network (RAN) 700 or the core network 710 in any combination. For example, while a first programmable network switch 702 is illustrated as replacing a SAE-GW and providing access to a first packet data network (PDN) 719, second and third programmable network switches 714, 715 are illustrated as replacing user plane gateways in the core network 710. Generally, the S-GW is divided into two entities, a SGW-U for processing data packets in the control plane, and a SGW-C for managing control signaling. This is one specific implementation of 4G CUPS. In some embodiments, the S-GW and P-GW may be combined into an SAE-GW, such that there are two gateways, an SAEGW-C for control-plane signaling and an SAEGW-U for user-plane data packet transmissions. Since it is beneficial to have the user plane co-located (or as close as network architecture allows) to the access node and/or the edge of the access network 900, and then directly egress from that user plane to the destination network (e.g. PDN 719), this configuration reduces or eliminates extraneous transport of data through the core network. For example, programmable network switch 702 enables direct user-plane access to a different PDN 719 directly from the access network 700, with the control signaling being provided by SGW-C 712 and/or PGW-C 713. Certain specialized applications that need to have connectivity at the edge of access network 700 benefit from this implementation, since the user plane 721 need not be traversed all the way into the core network 710. Certain application servers may be accessible via PDN 719, such that services corresponding to these application servers can be accessed directly, in contrast with other network nodes that may only be accessible via combination of PDN 720 and programmable network switch 715 functioning as a P-GW.

Therefore, these benefits may be further enhanced by providing a plurality of programmable network switches deployed close to access nodes, and fewer control plane elements (e.g. MME 711 and gateways 712, 713). For example, additional programmable network switches (such as programmable network switch 702) can be provided in addition to (or to replace) core network components such as a traditional SGW-U or PGW-U. Thus, incorporating the programmable network switches 714, 715 stands in contrast to prior-art gateways that comprise separate hardware switches and external host servers that may consume excessive network resources as described above. Whereas in the prior art, an external host server communicates with a switch and instructs the switch with regards to data management, in the disclosed embodiments, the data management functions described herein are programmed into the programmable network switches 714, 715, which eliminates the need for an external host server, as well minimizing excessive communication and signaling that is required to communicate between the prior-art switches and other gateways and servers. Thus, providing a programmable network switches 702, 714, 715 with multiple different functions that interface with each other and perform pipeline processing within a single unit preserves network resources such as power, bandwidth, etc.

As further described herein, the pipeline processing component and/or the auxiliary processing component is configured to transport data packets between wireless devices attached to access node 701 and one or more PDNs 719, 720, with source and destinations nodes including but not limited to application servers, session management, proxy, web server, media server, or end-user wireless devices coupled to another wireless network or RAN. Therefore, the programmable network switches 702, 714, 715 can include one or more ports that are associated with different reference points. For example, each programmable network switch 702, 714, 715 can include a first set of ports associated with reference points for data transmission between different network nodes, and a second set of ports associated with reference points for control signal transmission between different network nodes. For example, each programmable network switch 702, 714, 715 includes at least a port associated with S1-U or S5U reference points, which are used as a data input or output between the programmable network switch and access node 701, PDN 719, 720, between programmable network switches, e.g. programmable network switches 714, 715, etc. Further, each programmable network switch 714, 715 includes at least a port associated with a control signal reference point, which is used as an input for control signals via control plane 720. For example, as described herein, a management module in a programmable network switch is configured to receive session information from SGW-C 712 or PGW-C 713, via said port associated with the control transmissions reference point. The control information received via this port includes information related to provisioning a new session (e.g. using the packet forwarding control protocol (PFCP), quality of service information, billing information (including how and when to generate billing records), unique identifiers for a session, and so on. In an exemplary embodiment, information received via the control signal port enables the programmable network switch to perform session life cycle management.

Figure 8:
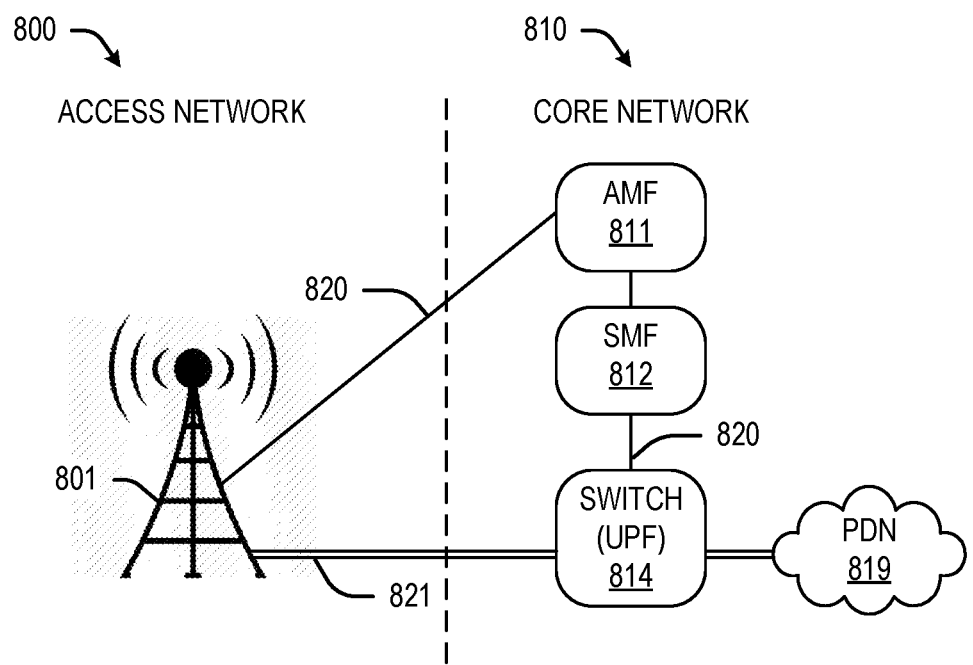
FIG. 8 depicts an exemplary programmable network switch implemented in a 5G system.

FIG. 8 depicts an exemplary programmable network switch 814 implemented in a 5G system. The components of exemplary 5G access network 800 include at least an access node 801, which can include a gNodeB, and may function similarly to access node 110 described in FIG. 1. Access network 800 can include other components not shown herein, such as cell site routers, gateways, switches, controllers, etc. In this embodiment, the programmable network switch 814 can be similar to the programmable network switches 300, 500 described in FIGS. 3, 5 respectively. For example, programmable network switch 814 can include a "white box switch" that executes a network operating system (NOS) using a processor (such as, for example, an X86 processor) and coupled to a pipeline processing component embedded into a hardware chip, such as an application-specific integrated circuit (ASIC). The ASIC may be configured as a network switch and may receive instructions from the NOS, and may further include its own operating system (OS) which interfaces with the NOS. Such a programmable network switch may comprise multiple hardware circuits and software modules associated with the different types of functions, all of which are incorporated into a single hardware unit, such as a rack-mountable unit. Data packets associated with data sessions are routed through a "pipeline" comprising these circuits and modules, such that the different types of functions are configured to perform "pipeline processing" of the data packets in real time.

Specifically, data packets traverse access network 800 and core network 810 via the user plane 821, while control signals are transmitted across access network 800 and core network 810 via the control plane 820. In an exemplary embodiment, access and mobility function (AMF) 811 and session management function (SMF) 812 function similarly to MME 711 described in FIG. 7. For example, the AMF 811 can receive connection requests from one or more wireless devices via access node 801, and manages anything to do with connection or mobility management, while forwarding session management requirements over an N11 interface to the SMF 812. Meanwhile, the SMF 812 is primarily responsible for interacting with the decoupled data plane 821, creating updating and removing Protocol Data Unit (PDU) sessions and managing session context with a User Plane Function (UPF), which in this embodiment, is replaced with a programmable network switch 814. Generally, the UPF represents the data plane evolution of a 4G CUPS system described in FIG. 7, which decouples PGW control and user plane functions, enabling the data forwarding component (PGW-U) to be decentralized. This allows packet processing and traffic aggregation to be performed closer to the network edge, increasing bandwidth efficiencies while reducing network. The PGW's handling signaling traffic (PGW-C) remain in the core, northbound of the Mobility Management Entity (MME). The UPF functions similarly, by providing an interconnect point between the mobile infrastructure and the packet data network (PDN) 819, encapsulation and decapsulation of GPRS Tunnelling Protocol for the user plane (GTP-U), acting as a PDU session anchor point for providing mobility within and between Radio Access Technologies (RATs), including sending one or more end marker packets to the gNodeB 801, and packet routing and forwarding functions.

Meanwhile, as described herein, traditional UPFs practically include a plurality of different servers and switches, thereby adding signaling complexity to existing networks. These various components also utilize excessive resources, since they usually comprise general purpose servers running a standard operating system that is configured to implement the interfaces between the control plane 820 and the UPF, and would need to provision the management functions of the data down to the hardware switches responsible for transporting data across the user plane 821, thereby creating a bottleneck in communication. Thus, incorporating the programmable network switch 814, configured to perform the various data session management functions performed by prior-art UPFs, eliminates the need for an external host server, as well minimizing excessive communication and signaling that is required to communicate between the prior-art switches and other gateways and servers. Further, providing a programmable network switch 814 with multiple different functions that interface with each other and perform pipeline processing within a single unit preserves network resources such as power, bandwidth, etc.

Further, the programmable network switch 814 can include one or more ports that are associated with different reference points. For example, programmable network switch 814 can include a first set of ports associated with reference points for data transmission between different network nodes, and a second set of ports associated with reference points for control signal transmission between different network nodes. This can include at least a port associated with the N3 reference point, which is used as a data input or output between the programmable network switch and access node 801. Further, programmable network switch 814 includes at least a port associated with the N6 reference point, which is used as a data input or output between the programmable network switch and PDN 819. Further, the programmable network switch 814 includes at least a port associated with the N9 reference point, which is used as a data input or output between other programmable network switches not shown herein. Further, the programmable network switch 814 includes at least a port associated with a control signal reference point, such as the N4 reference point, which is used as an input for control signals via control plane 820. For example, as described herein, a management module in programmable network switch 814 is configured to receive session information from SMF 812, via the port associated with the N4 reference point. The control information received via the N4 reference point includes information related to provisioning a new session (e.g. using the packet forwarding control protocol (PFCP), quality of service information, billing information (including how and when to generate billing records), unique identifiers for a session, and so on. In an exemplary embodiment, information received via the N4 reference point enables the programmable network switch 814 to perform session life cycle management.

Further, several programmable network switches can be arranged such that data packets originating from various RANs can traverse minimal other networks or nodes to reach their destination. Incorporating data management functions into these programmable network switches also minimizes the need for extra control plane elements and communication therebetween. Since it is beneficial to have the user plane co-located (or as close as network architecture allows) to the access node, and then directly egress from that user plane to the destination network (e.g. PDN 819), this configuration reduces or eliminates extraneous transport of data through the core network. These benefits may be further enhanced by providing a plurality of programmable network switches deployed close to access nodes, and fewer control plane elements (e.g. AMF 811 and SMF 812).

Figure 9:
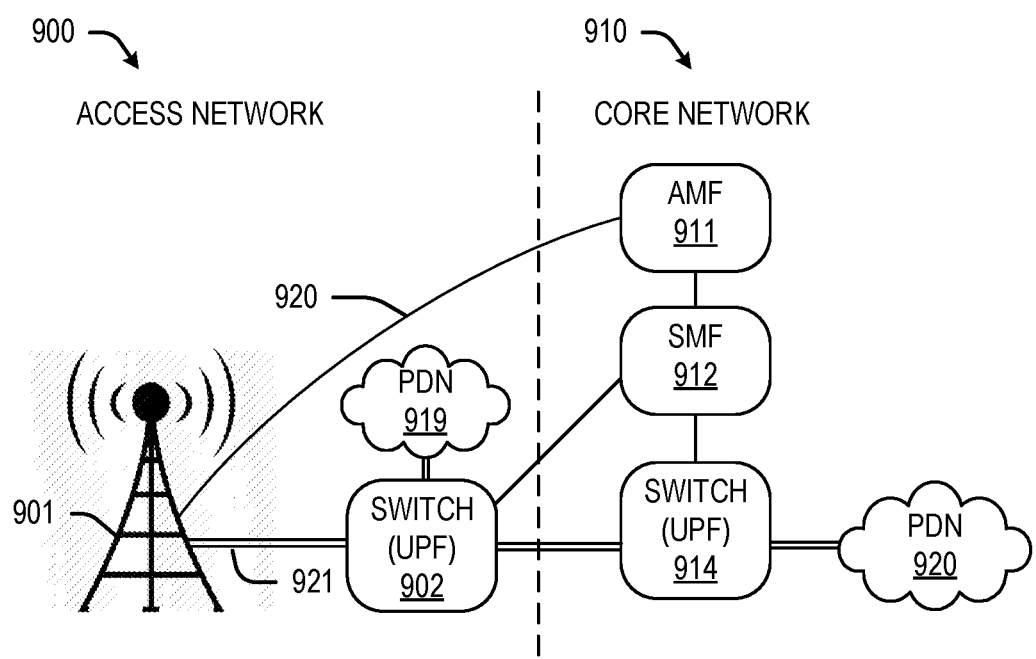
FIG. 9 depicts a plurality of exemplary programmable network switches implemented in a 5G system.

For example, FIG. 9 illustrates a plurality of exemplary programmable network switches provided in a 5G network. Similar to FIG. 8, the components of exemplary 5G access network 900 include at least an access node 901, which can include a gNodeB, and may function similarly to access node 110 described in FIG. 1. Further, access network 900 includes an additional programmable network switch 902 configured to communicate with a packet data network 919. Other components not shown herein, such as cell site routers, gateways, switches, controllers, etc. may be envisioned by those having ordinary skill in the art in light of this disclosure. In this embodiment, the programmable network switches 902, 914 can be similar to the programmable network switches 300, 500 described in FIGS. 3, 5 respectively. For example, programmable network switch 902, 914 can include a "white box switch" that executes a network operating system (NOS) using a processor (such as, for example, an X86 processor) and coupled to a pipeline processing component embedded into a hardware chip, such as an application-specific integrated circuit (ASIC). The ASIC may be configured as a network switch and may receive instructions from the NOS, and may further include its own operating system (OS) which interfaces with the NOS. Such a programmable network switch may comprise multiple hardware circuits and software modules associated with the different types of functions, all of which are incorporated into a single hardware unit, such as a rack-mountable unit. Data packets associated with data sessions are routed through a "pipeline" comprising these circuits and modules, such that the different types of functions are configured to perform "pipeline processing" of the data packets in real time.

Similar to programmable network switch 702 in FIG. 7, in this case, programmable network switch 902 enables direct user-plane access to a different PDN 919 directly from the access network 900, with the control signaling being provided by SMF 912. Certain specialized applications that need to have connectivity close to the access network 900 benefit from this implementation, since the user plane 921 need not be traversed all the way into the core network 910. Certain application servers may be accessible via PDN 919, such that services corresponding to these application servers can be accessed directly, in contrast with other network nodes that may only be accessible via combination of PDN 920 and programmable network switch 915 functioning as a P-GW. This is beneficial for edge-deployment of network services, versus other network nodes that are only accessible via PDN 920.

Further, the programmable network switches 902, 914 can include one or more ports that are associated with different reference points. For example, each programmable network switch 902, 914 can include a first set of ports associated with reference points for data transmission between different network nodes, and a second set of ports associated with reference points for control signal transmission between different network nodes. This can include at least a port associated with the N3 reference point, which is used as a data input or output between the programmable network switch and access node 901. Further, each programmable network switch 902, 914 includes at least a port associated with the N6 reference point, which is used as a data input or output between the programmable network switch and PDN 919, 920. Further, each programmable network switch 902, 914 includes at least a port associated with the N9 reference point, which is used as a data input or output between other programmable network switches not shown herein. Further, each programmable network switch 902, 914 includes at least a port associated with a control signal reference point, such as the N4 reference point, which is used as an input for control signals via control plane 920. For example, as described herein, a management module in each programmable network switch 902, 914 is configured to receive session information from SMF 912, via the port associated with the N4 reference point. The control information received via the N4 reference point includes information related to provisioning a new session (e.g. using the packet forwarding control protocol (PFCP), quality of service information, billing information (including how and when to generate billing records), unique identifiers for a session, and so on. In an exemplary embodiment, information received via the N4 reference point enables each programmable network switch 902, 914 to perform session life cycle management.

In light of this disclosure, it will be evident to those having ordinary skill in the art that any specialized circuits including FPGAs, ASICs, and other types of processors, can be configured to perform the pipeline processing, auxiliary processing (i.e. pre and post processing), and data management operations, so long as they are in direct communication with each other and incorporated within a small 1-2 unit network node, thereby mitigating the need for extraneous communication across different network nodes in different geographical regions. Further, the exemplary embodiments described herein can be performed under the control of a processing system executing computer-readable codes embodied on a computer-readable recording medium or communication signals transmitted through a transitory medium. The computer-readable recording medium is any data storage device that can store data readable by a processing system, and includes both volatile and nonvolatile media, removable and non-removable media, and contemplates media readable by a database, a computer, and various other network devices.

Examples of the computer-readable recording medium include, but are not limited to, read-only memory (ROM), random-access memory (RAM), erasable electrically programmable ROM (EEPROM), flash memory or other memory technology, holographic media or other optical disc storage, magnetic storage including magnetic tape and magnetic disk, and solid state storage devices. The computer-readable recording medium can also be distributed over network-coupled computer systems so that the computer-readable code is stored and executed in a distributed fashion. The communication signals transmitted through a transitory medium may include, for example, modulated signals transmitted through wired or wireless transmission paths.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

The invention claimed is:

1. A programmable network switch, comprising:
    a pipeline processing component configured to perform pipeline processing operations on data packets received at the programmable network switch, wherein the pipeline processing component transports data packets between a wireless network and a packet data network; and
    a processing node configured to perform management functions for data sessions associated with the data packets, the management functions including at least transmitting session data associated with the data sessions to the pipeline processing component,
    wherein the pipeline processing component and processing node are combined into a single housing of the programmable network switch, the pipeline processing component embedded on a first circuit within the single housing, and the processing node comprises a memory and a processor communicatively coupled to the first circuit.

2. The programmable network switch of claim 1, wherein the management functions further comprise one or more of receiving control information from a session management server, associating data packets with one or more of source nodes, destination nodes, bearers, tunnels, quality of service, or guaranteed bit rate associated with the data packets, modifying headers of the data packets, or encapsulating or decapsulating data packets.

3. The programmable network switch of claim 2, wherein the pipeline processing operations comprise one or more of modifying headers of the data packets, encapsulating or decapsulating data packets, applying a quality of service policy to data packets, buffering data packets, or transmitting data packets to a destination node.

4. The programmable network switch of claim 1, further comprising an auxiliary processing component embedded on a second circuit within the single housing, the auxiliary processing component configured to perform at least a subset of the pipeline processing operations.

5. The programmable network switch of claim 4, wherein the first circuit comprises an application-specific integrated circuit (ASIC), and the second circuit comprises a field-programmable gate array (FPGA).

6. The programmable network switch of claim 5, wherein the FPGA comprises a memory, and is configured to perform routing table lookups based on routing tables stored on the memory, matching data packets with bearers and destination nodes based on information in routing tables, matching header values with routing tables, modifying headers associated with the data packets, and buffering data packets on the memory.

7. The programmable network switch of claim 4, wherein the auxiliary processing component is configured to instruct the pipeline processing component how to route the data packets.

8. The programmable network switch of claim 4, wherein the auxiliary processing component is configured to receive session data from the processing node.

9. The programmable network switch of claim 1, wherein the programmable network switch is co-located with an access node such that the data packets flow directly egress a user plane at a radio access network of the wireless network to the packet data network.

10. The programmable network switch of claim 1, further comprising one or more interfaces enabling coupling to different network nodes.

11. The programmable network switch of claim 10, wherein the different network nodes comprise access nodes or wireless devices, one or more gateways or functions on the core network, or any other network node on the packet data network.

12. A system, comprising:
a radio access network;
a core network communicatively coupled to the radio access network; and
one or more programmable network switches provided in the radio access network or the core network; each programmable network switch of the one or more programmable network switches comprising:
- a pipeline processing component configured to perform pipeline processing operations on data packets received at the programmable network switch, wherein the pipeline processing component transports data packets between a wireless network and a packet data network; and
- a processing node configured to perform management functions for data sessions associated with the data packets, the management functions including at least transmitting session data associated with the data sessions to the pipeline processing component,
- wherein the pipeline processing component and the processing node are combined into a single housing of the programmable network switch, the pipeline processing component embedded on a first circuit within the single housing, and the processing node stored on a first memory of the programmable network switch and executed by a processor communicatively coupled to the first circuit.

13. The system of claim 12, wherein the management functions further comprise one or more of receiving control information from a session management server, associating data packets with one or more of source nodes, destination nodes, bearers, tunnels, quality of service, or guaranteed bit rate associated with the data packets, modifying headers of the data packets, or encapsulating or decapsulating data packets.

14. The system of claim 13, wherein the pipeline processing operations comprise one or more of modifying headers of the data packets, encapsulating or decapsulating data packets, applying a quality of service policy to data packets, buffering data packets, or transmitting data packets to a destination node.

15. The system of claim 13, further comprising an auxiliary processing component embedded on a second circuit within the single housing, the auxiliary processing component configured to perform at least a subset of the pipeline processing operations.

16. The system of claim 15, wherein the auxiliary processing component comprises a second memory, and is configured to perform routing table lookups based on routing tables stored on the second memory, matching data packets with bearers and destination nodes based on information in routing tables, matching header values with routing tables, modifying headers associated with the data packets, and buffering data packets on the second memory.

17. A method, comprising:
receiving, at a pipeline processing circuit of a programmable network switch, a data packet associated with a session, wherein the pipeline processing circuit transports data packets between a wireless network and a packet data network;
retrieving, at the pipeline processing circuit, session data associated with the session, the session data having been previously provided to the pipeline processing circuit by a processing node of the programmable network switch, wherein the pipeline processing circuit and processing node are combined into a single housing of the programmable network switch, the pipeline processing circuit embedded on a first circuit within the single housing, and the processing node comprises a memory and a processor communicatively coupled to the first circuit;
performing pipeline processing operations to the data packet, the pipeline processing operations including at least modifying headers of the data packet according to the session data provided by the processing node; and
releasing the data packet to another network node.

18. The method of claim 17, further comprising:
determining, at the pipeline processing circuit, that updated session data is required for the data packet;
transmitting the data packet to the processing node of the programmable network switch; and
receiving the data packet along with updated session data from the processing node,
wherein upon receiving the data packet along with the updated session data, the pipeline processing circuit is configured to repeat the retrieving session data and performing the pipeline processing operations.

* * * * *